(12) United States Patent
Zhu et al.

(10) Patent No.: US 7,202,132 B2
(45) Date of Patent: Apr. 10, 2007

(54) PROTECTING SILICON GERMANIUM SIDEWALL WITH SILICON FOR STRAINED SILICON/SILICON GERMANIUM MOSFETS (75) Inventors: Huilong Zhu, Poughkeepsie, NY (US); Bruce B. Doris, Brewster, NY (US); Dan M. Mocuta, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 10/707,840

(22) Filed: Jan. 16, 2004

(65) Prior Publication Data
US 2005/0156154 A1 Jul. 21, 2005

(51) Int. Cl.
H01L 21/336 (2006.01)

(52) U.S. Cl. ............... 438/300; 257/377; 257/E21.619; 257/E21.622; 438/299; 438/311

(58) Field of Classification Search ............... 257/377; 438/299, 300
See application file for complete search history.

(56) References Cited

U.S. PATENT DOCUMENTS

| | | | |
|---|---|---|---|
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |

(Continued)

FOREIGN PATENT DOCUMENTS

JP 64-76755 3/1989

OTHER PUBLICATIONS

Kern Rim, et al., "Transconductance Enhancement in Deep Submicron Strained-Si n-MOSFETs", International Electron Devices Meeting, 26, 8, 1, IEEE, Sep. 1998.
Kern Rim, et al., "Characteristics and Device Design of Sub-100 nm Strained Si N- and PMOSFETs", 2002 Symposium On VLSI Technology Digest of Technical Papers, IEEE, pp. 98-99.
Gregory Scott, et al., "NMOS Drive Current Reduction Caused by Transistor Layout and Trench Isolation Induced Stress", International Electron Devices Meeting, 34.4.1, IEEE, Sep. 1999.

(Continued)

Primary Examiner—Andy Huynh
Assistant Examiner—Dao H. Nguyen
(74) Attorney, Agent, or Firm—Joseph P. Abate; Greenblum & Bernstein, P.L.C.

(57) ABSTRACT

Raised Si/SiGe source and drain regions include epitaxially grown silicon on SiGe sidewalls. The epi silicon prevents adverse effects of Ge during silicidation, including Ge out diffusion and silicide line breakage. The Si also increases the active area.

32 Claims, 5 Drawing Sheets

U.S. PATENT DOCUMENTS

| | | | |
|---|---|---|---|
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,716 | A | 8/1999 | Jin et al. |
| 5,940,736 | A | 8/1999 | Brady et al. |
| 5,946,559 | A | 8/1999 | Leedy |
| 5,955,770 | A * | 9/1999 | Chan et al. .................. 257/408 |
| 5,960,297 | A | 9/1999 | Saki |
| 5,981,356 | A | 11/1999 | Hsueh et al. |
| 5,989,978 | A | 11/1999 | Peidous |
| 6,008,126 | A | 12/1999 | Leedy |
| 6,066,545 | A | 5/2000 | Doshi et al. |
| 6,080,637 | A | 6/2000 | Huang et al. |
| 6,090,684 | A | 7/2000 | Ishitsuka et al. |
| 6,093,621 | A | 7/2000 | Tseng |
| 6,107,143 | A | 8/2000 | Park et al. |
| 6,117,722 | A | 9/2000 | Wuu et al. |
| 6,214,679 | B1 * | 4/2001 | Murthy et al. ............... 438/299 |
| 6,221,735 | B1 | 4/2001 | Manley et al. |
| 6,228,694 | B1 | 5/2001 | Doyle et al. |
| 6,248,637 | B1 * | 6/2001 | Yu ............................. 438/300 |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,406,973 | B1 | 6/2002 | Lee |
| 6,420,766 | B1 * | 7/2002 | Brown et al. ................ 257/401 |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,506,652 | B2 | 1/2003 | Jan et al. |
| 6,509,618 | B2 | 1/2003 | Myers et al. |
| 6,521,964 | B1 | 2/2003 | Jan et al. |
| 6,583,060 | B2 | 6/2003 | Trivedi |
| 6,717,216 | B1 | 4/2004 | Doris et al. |
| 6,777,759 | B1 * | 8/2004 | Chau et al. .................. 257/377 |
| 6,825,529 | B2 | 11/2004 | Chidambarrao et al. |
| 6,831,292 | B2 | 12/2004 | Currie et al. |
| 6,939,751 | B2 * | 9/2005 | Zhu et al. .................... 438/151 |
| 6,974,981 | B2 | 12/2005 | Chidambarrao et al. |
| 6,977,194 | B2 | 12/2005 | Belyansky et al. |
| 7,015,082 | B2 | 3/2006 | Doris et al. |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2004/0238914 | A1 | 12/2004 | Deshpande et al. |
| 2004/0262784 | A1 | 12/2004 | Doris et al. |
| 2005/0040460 | A1 | 2/2005 | Chidambarrao et al. |
| 2005/0082634 | A1 | 4/2005 | Doris et al. |
| 2005/0093030 | A1 | 5/2005 | Doris et al. |
| 2005/0098829 | A1 | 5/2005 | Doris et al. |
| 2005/0106799 | A1 | 5/2005 | Doris et al. |
| 2005/0145954 | A1 | 7/2005 | Zhu et al. |
| 2005/0148146 | A1 | 7/2005 | Doris et al. |
| 2005/0194699 | A1 | 9/2005 | Belyansky et al. |
| 2005/0236668 | A1 | 10/2005 | Zhu et al. |
| 2005/0245017 | A1 | 11/2005 | Belyansky et al. |
| 2005/0280051 | A1 | 12/2005 | Chidambarrao et al. |
| 2005/0282325 | A1 | 12/2005 | Belyansky et al. |
| 2006/0027868 | A1 | 2/2006 | Doris et al. |
| 2006/0057787 | A1 | 3/2006 | Doris et al. |
| 2006/0060925 | A1 | 3/2006 | Doris et al. |

OTHER PUBLICATIONS

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors," IEEE Transactions on Electron Devices, vol. 49, No. 12, Dec. 2002, pp. 2151-56.

H.S. Momose, et al., "Temperature Dependence of Emitter-Base Reverse Stress Degradation and its Mechanism Analyzed by MOS Structures," 1989 IEEE, Paper 6.2, pp. 140-143.

C.J. Huang, et al., "Temperature Dependence and Post-Stress Recovery of Hot Electron Degradation Effects in Bipolar Transistors," IEEE 1991, Bipolar Circuits and Technology Meeting 7.5, pp. 170-173.

S.R. Sheng, et al., "Degradation and Recovery of SiGe HBTs Following Radiation and Hot-Carrier Stressing," pp. 14-15.

Z. Yang, et al., "Avalanche Current Induced Hot Carrier Degradation in 200 GHz SiGe Heterojunction Bipolar Transistors," pp. 1-5.

H. Li, et al., "Design of W-Band VCOs with High Output Power for Potential Application in 77 GHz Automotive Radar Systems." 2003, IEEE GaAs Digest, pp. 263-66.

H. Wurzer, et al., "Annealing of Degraded non-Transistors-Mechanisms and Modeling," IEEE Transactions on Electron Devices, vol. 41, No. 4, Apr. 1994, pp. 533-38.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft =350/300 GHz and Gate Delay Below 3.3 ps", 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Sealability". 2000, IEEE, pp. 151-154.

* cited by examiner

PROTECTING SILICON GERMANIUM SIDEWALL WITH SILICON FOR STRAINED SILICON/SILICON GERMANIUM MOSFETS

BACKGROUND OF INVENTION

The invention generally relates to a semiconductor device and method of manufacture and, more particularly, to a semiconductor device that includes strained silicon/silicon germanium field effect transistors with a protective silicon layer.

As silicon film thickness of Silicon On Insulator (SOI) is reduced, for high-performance CMOS fabrication, it becomes necessary to increase the thickness of source/drain regions above the SOI thickness. This results from the fact that, as the SOI film becomes thinner, a reduced amount of Si material is available from which to form silicide for source/drain contacts. Additionally, thinner source/drain regions can degrade on-current due to increased series resistance.

To maintain or reduce overall source/drain series resistance, including the silicide contact resistance, techniques have emerged to form raised source/drain (RSD) structures. For example, selective epitaxial growth of silicon has been used to grow silicon on the source/drain and the top of poly gates, leaving no silicon on gate sidewall spacers. One problem with this technique is that epitaxial growth must take place at temperatures as high as 750° C., which may cause significant transient enhanced diffusion of dopants. The unnecessary dopant redistribution in halo/extension regions degrades the performance of devices and short channel immunity. Moreover, with a very thin SOI film, it can be difficult to form epitaxial silicon without causing silicon agglomeration due to possible contamination of carbon in certain chemical vapor deposition tools.

Another technique involves SiGe selective epitaxial growth on source/drain regions. Advantageously, this technique eliminates transient enhanced diffusion of dopants which may otherwise occur at high temperatures. Unfortunately, however, Ge degrades silicide contact formation and contact resistance due to its inherent function as a diffusion barrier. To reduce such undesirable effects, the surface of SiGe may be capped with additional epitaxial silicon, using a high temperature process, which may cause transient enhanced diffusion.

Another problem with raised silicon/silicon germanium source and drain regions involves contact formation. High quality contacts to silicon-based field effect transistors are typically achieved through a silicide process, where a metal such as cobalt or titanium is alloyed with silicon to form the contact. However, this process is generally not as effective with semiconductor materials other than silicon. For example, a cobalt silicide contact formed to a source disposed in a strained Si layer and an underlying SiGe layer may form a high-resistivity compound in the SiGe layer, thereby compromising the functionality of the contact.

The invention is directed to overcoming one or more of the problems as set forth above.

SUMMARY OF INVENTION

In a first aspect of the invention, a method of fabricating a semiconductor structure is provided. The method entails forming a raised source region on a substrate. A raised drain region is also formed on the substrate. Next, a first silicon layer is formed over the raised source region and a second silicon layer is formed over the raised drain region.

In a second aspect of the invention, the method includes forming sacrificial spacers along the sidewalls of the first silicon layer and the second silicon layer. After forming the spacers, third and fourth silicon layers are formed on the raised source and raised drain regions, respectively.

In a third aspect of the invention, a semiconductor structure is provided. The semiconductor structure includes a substrate; a raised source region on the substrate, a raised drain region on the substrate; a first silicon layer over the raised source region and a second silicon layer over the raised drain region.

The raised source and drain regions thus include one or more silicon layers on sidewalls of the source and drain regions. The silicon prevents adverse effects of Ge during silicidation, including Ge out diffusion and silicide line breakage. The Si also increases the active area.

DETAILED DESCRIPTION

The invention enables fabrication of raised Si/SiGe source and drain regions with epitaxially grown silicon on SiGe sidewalls. The silicon prevents adverse effects of Ge during silicidation, including Ge out diffusion and silicide line breakage. The Si also increases the active area.

Figure 1:
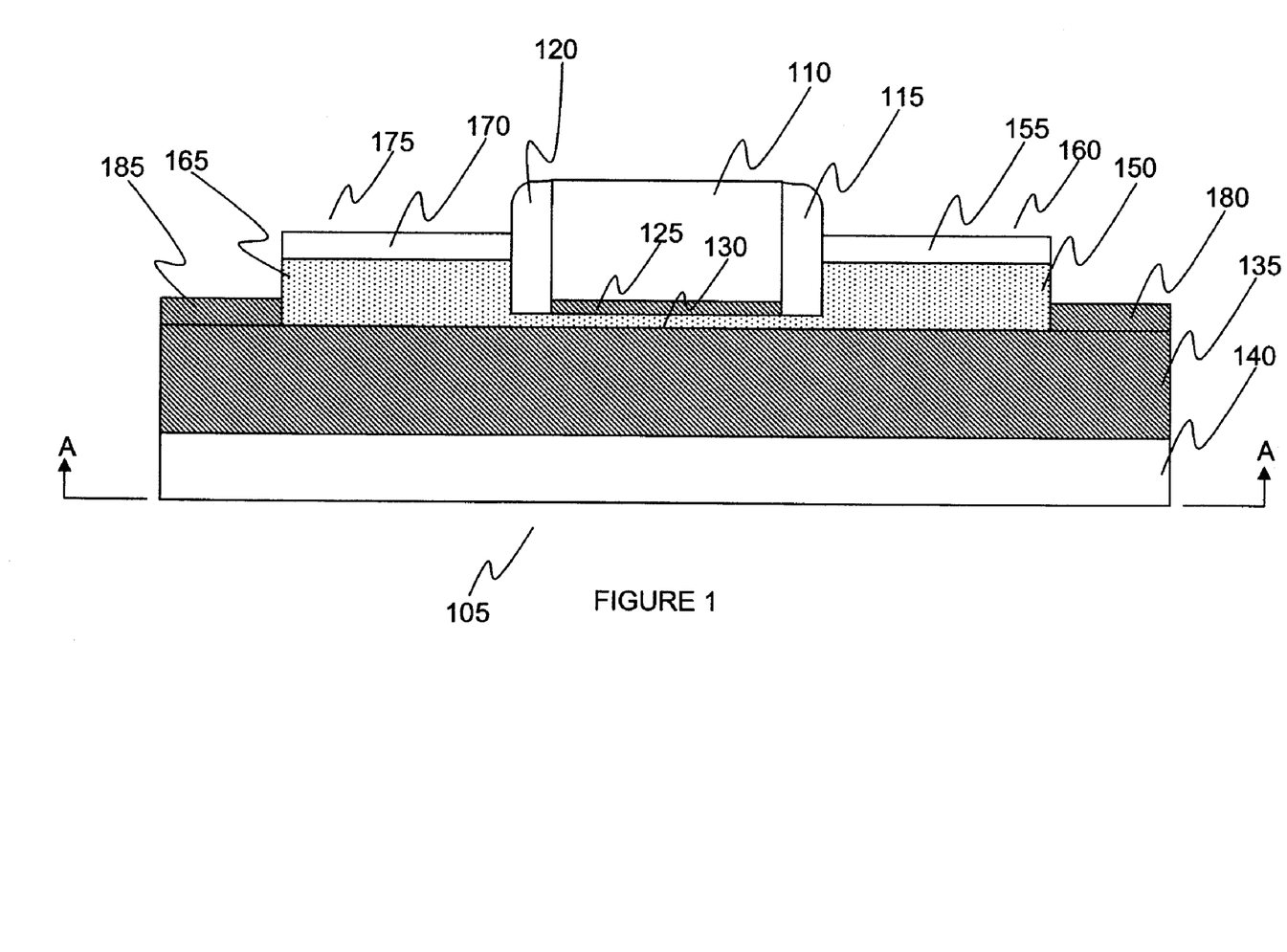
FIG. 1 shows a first side cutaway view of an exemplary semiconductor structure with a raised source and drain according to the principles of the invention.

Referring to FIG. 1, an exemplary initial structure employed in the invention is shown. Specifically, the exemplary initial structure is comprised of an SOI substrate 105 having a patterned gate stack region 110 formed on the surface thereof. The SOI substrate 105 may include a buried oxide layer 135 sandwiched between a top Si-containing layer 130 and a bottom Si-containing layer 140. The top Si-containing layer 130 is an area upon which devices may be formed. The Si-containing layer 130 may be comprised of various semiconducting materials that include silicon, such as Si, SiGe, SiC, SiGeC, Si/Si, or Si/SiGe.

The SOI substrate 105 employed in the present invention may be fabricated using techniques well known to those skilled in the art. For example, the SOI substrate may be formed by a conventional bonding and cutting processes, or alternatively, a conventional separation by implantation of oxygen (SIMOX) process. While the thickness of the various layers is not critical to the present invention, the top Si-containing layer 130 may have a thickness of about 5 to 250 nm.

Isolation structures, such as shallow-trench isolations (STIs) 180 and 185, are also provided in the exemplary initial structure. Techniques known in the art may be utilized to form STIs 180 and 185. A conventional technique entails patterning with a photoresist, etching the trench, chemical vapor deposition of oxide to fill the trench, and planarizing the surface such as by chemical mechanical polishing. Subsequently, the top surface of the STI formations 180 and 185 may be etched down, as discussed more fully below.

The patterned gate stack region 110 may be formed atop the Si-containing layer using processing techniques well known in the art. For example, the patterned gate stack region 110 may be fabricated by first forming gate dielectric 125 on an exposed surface of the top Si-containing layer 130. The gate dielectric layer 125 may be formed by a conventional deposition process such as CVD or plasma-assisted CVD, or a thermal growing process such as oxidation, nitridation or oxynitridation. The gate dielectric may include any device quality dielectric material such as an oxide, nitride, oxynitride or any combination and multilayer thereof. The thickness of the gate dielectric is not critical to the present invention.

The gate stack 110 is formed on the gate dielectric 125 utilizing a conventional deposition process such as CVD, plasma-assisted CVD or plating. The gate stack 110 may include a gate material such as polysilicon, amorphous silicon or other materials suitable for MOSFET gate composition. The gate material may be formed on the surface of gate dielectric 125 utilizing conventional deposition processes well known in the art such as, for example, CVD or plasma-assisted CVD. An optional dielectric-capping layer (not shown) may be present atop the gate material. When present, the optional dielectric-capping layer may typically be comprised of an oxide, nitride or oxynitride and formed utilizing a conventional deposition process such as, for example, CVD or plasma-assisted CVD. Alternatively, a conventional thermal growing process such as, for example, oxidation, may be used in forming an optional dielectric-capping layer.

Following formation of the gate stack 110 on the gate dielectric layer 125, the gate stack 110 and gate dielectric layer 125 are subjected to a conventional patterning process which includes lithography and etching steps. By way of example, the lithography step may entails applying a photoresist, exposing the photoresist to a pattern of radiation, and developing the pattern utilizing a conventional resist developer. Following the lithography step, a conventional etching process such as reactive-ion etching, plasma etching, ion beam etching or laser ablation may be employed in transferring the pattern to the gate stack 110 and the gate dielectric 125.

Spacers 115 and 120 are formed along gate sidewalls. For example, spacer material such as a nitride (e.g., $Si_3N_4$) may be deposited in a conventional manner, such as by chemical vapor deposition (CVD) using a silane source. Other techniques, which may be suitable for deposition of a nitride layer, include low-pressure CVD (LPCVD) and atmospheric pressure (CVD) (APCVD). Portions of the deposited nitride layer are subsequently etched away in a conventional manner to form the spacers 115 and 120.

After spacer formation, raised source and drain regions are formed in a conventional manner. As illustrated in FIG. 1, exemplary source and drain regions 160 and 175 are comprised of SiGe layers 150 and 165 capped with strained silicon layers 155 and 170. The SiGe layers 150 and 165 may be selectively epitaxially grown in a conventional manner using ultrahigh-vacuum chemical vapor deposition (UHVCVD), molecular beam epitaxy (MBE), low pressure chemical vapor deposition (LPCVD), rapid thermal chemical vapor deposition (RTCVD), and low energy plasma enhanced chemical vapor deposition (LEPECVD). Alternatively, the SiGe layers 150 and 165 may be comprised, in whole or in part, of the top silicon-containing layer 130 of the SOI substrate 105.

Silicon layers 155 and 170 may be formed on the SiGe layers 150 and 165 of the raised source and drain regions 160 and 175, respectively, using a conventional selective epitaxial silicon formation technique. For example, molecular beam epitaxy (MBE) may be used to selectively grow device quality silicon. Because Si has a smaller lattice constant (i.e., atom spacing) than Ge, when Si 155 and 170 is grown on the SiGe layer 160 and 165, the Si 155 and 170 is strained in tension. A suitable thickness for the strained Si layers 155 and 170 is below the critical thickness, which is the maximum thickness that strained Si can grow on the SiGe layers 150 and 165 without forming defects in the crystal structure (e.g., dislocations). By way of example but not limitation, the strained Si layer 155 may be approximately 5 to 100 nm thick.

Figure 2:
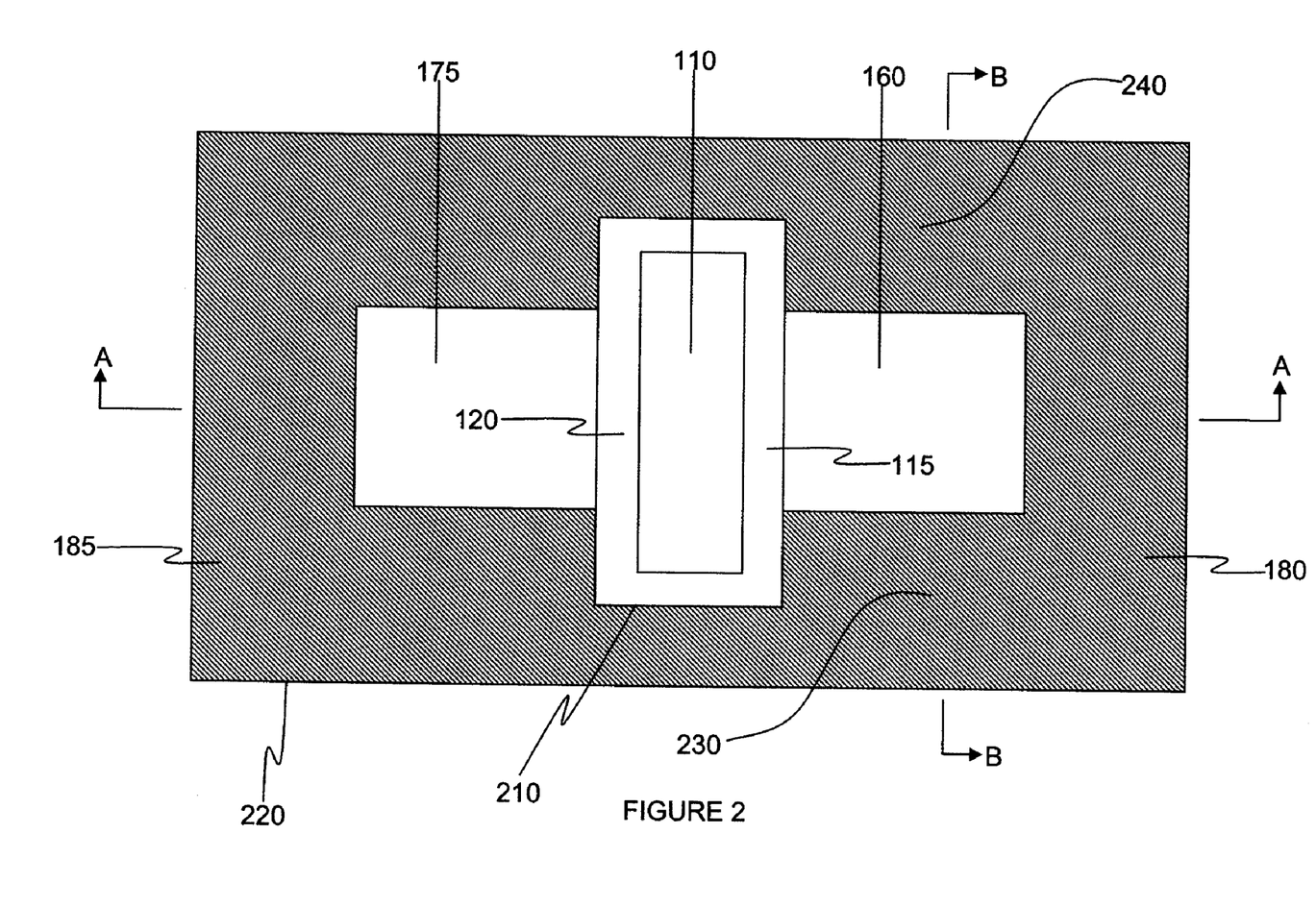
FIG. 2 shows a top view of an exemplary semiconductor structure with a raised source and drain according to the principles of the invention.

Referring now to FIG. 2, a top view of the exemplary initial structure is shown. Raised drain 160 and source 175 regions are provided adjacent to nitride spacer sides 115 and 120, respectively. The nitride spacer 210 surrounds the sidewalls of the gate 110. The shallow trench isolation 220, including STI sides 180 and 185, surround the active area. The cutaway view represented in FIG. 1 is denoted by cutaway line A—A in FIG. 2.

Figure 3:
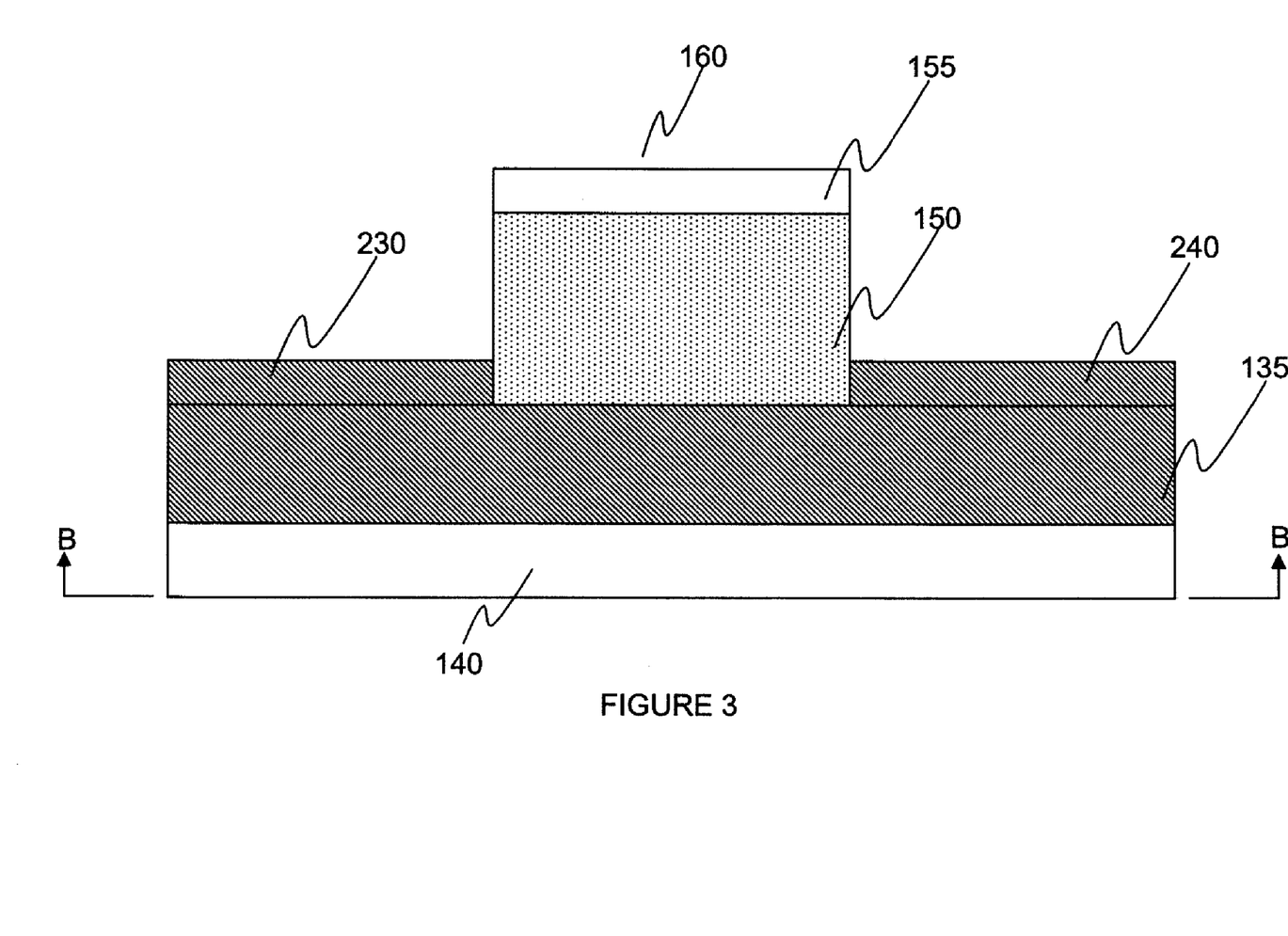
FIG. 3 shows a second side cutaway view of an exemplary semiconductor structure with a raised source and drain according to the principles of the invention.

Referring now to FIG. 3, a side view of a cutaway section represented by line B—B in FIG. 2 is shown. Those skilled in the art will appreciate that the structure and process steps described below for the raised drain region apply equally as well to the raised source region.

STI oxide portions 230 and 240 are shown alongside the raised drain 160 comprised of SiGe layer 150 and strained Si layer 160. The top layer 130 of the exemplary SOI substrate may be comprised of the same material as the raised drain layer 150, namely SiGe. Thus, referring again to FIG. 1, SiGe layers 150 and 165 may be comprised of the top layer of the exemplary SOI substrate. In such a case, STIs may be formed from the SOI substrate surface to the top of the buried oxide layer 135. Then, the STI oxide may be etched to reveal the raised SiGe portions of raised source and drain regions, such as SiGe layer 150 in FIG. 3. This approach for raised source and drain formation may obviate the need to form layer 150 separately by epitaxial growth as described above.

Figure 4:
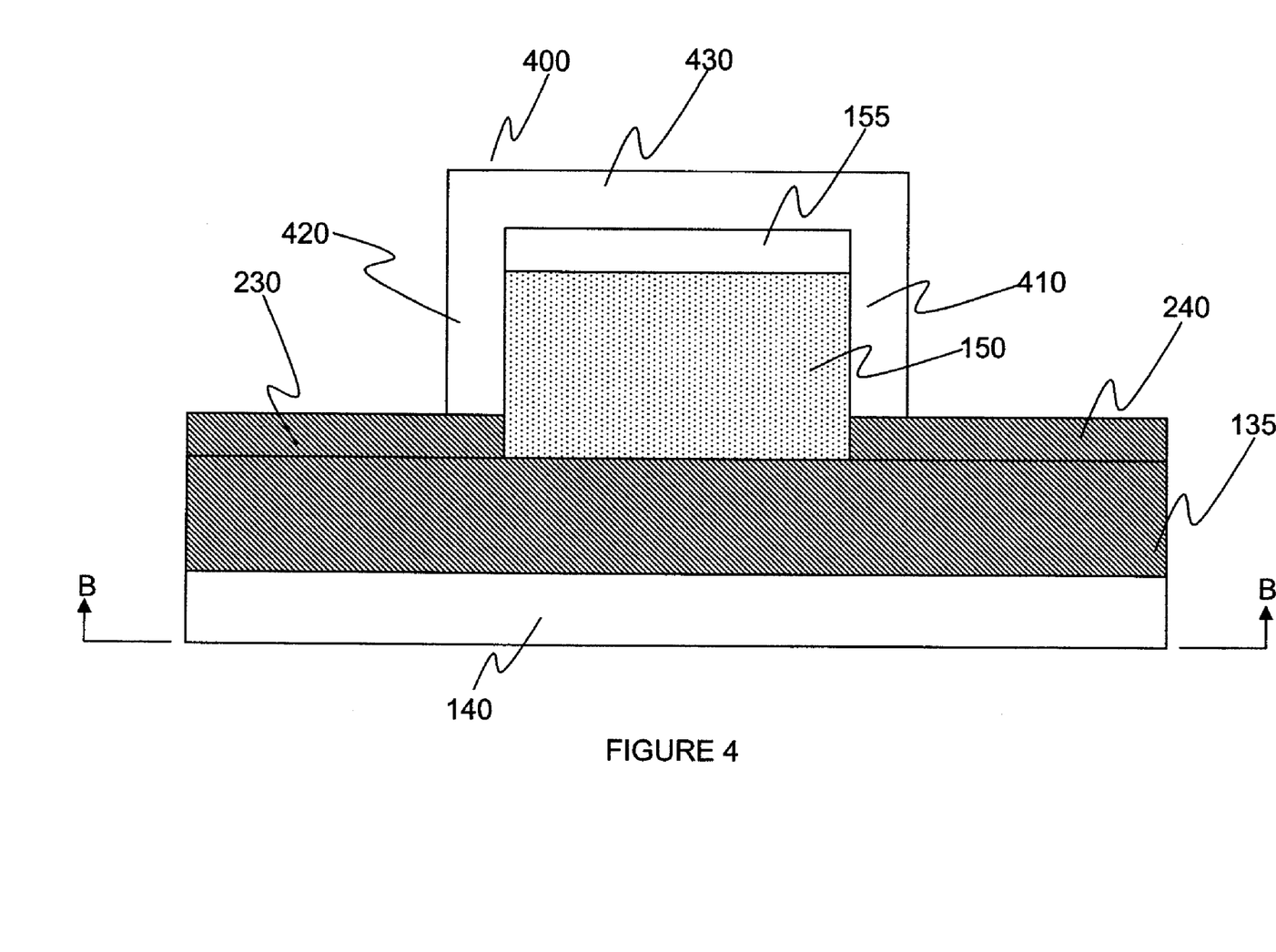
FIG. 4 shows cutaway view of an exemplary semiconductor structure with a raised source and drain and a protective silicon layer according to the principles of the invention.

Next, the raised drain 160 is protected with a silicon layer 400, as shown in FIG. 4. In particular, silicon is selectively epitaxially grown on the SiGe sidewalls of the raised drain 160, forming protective silicon sidewalls 410 and 420. The selective epitaxial process also results in growth of silicon on the strained silicon layer 155, forming silicon cap 430 for the raised drain 160. The epitaxial silicon layer 400 may be formed using conventional selective epitaxial growing processes known in the art, such as molecular beam epitaxy.

Figure 5:
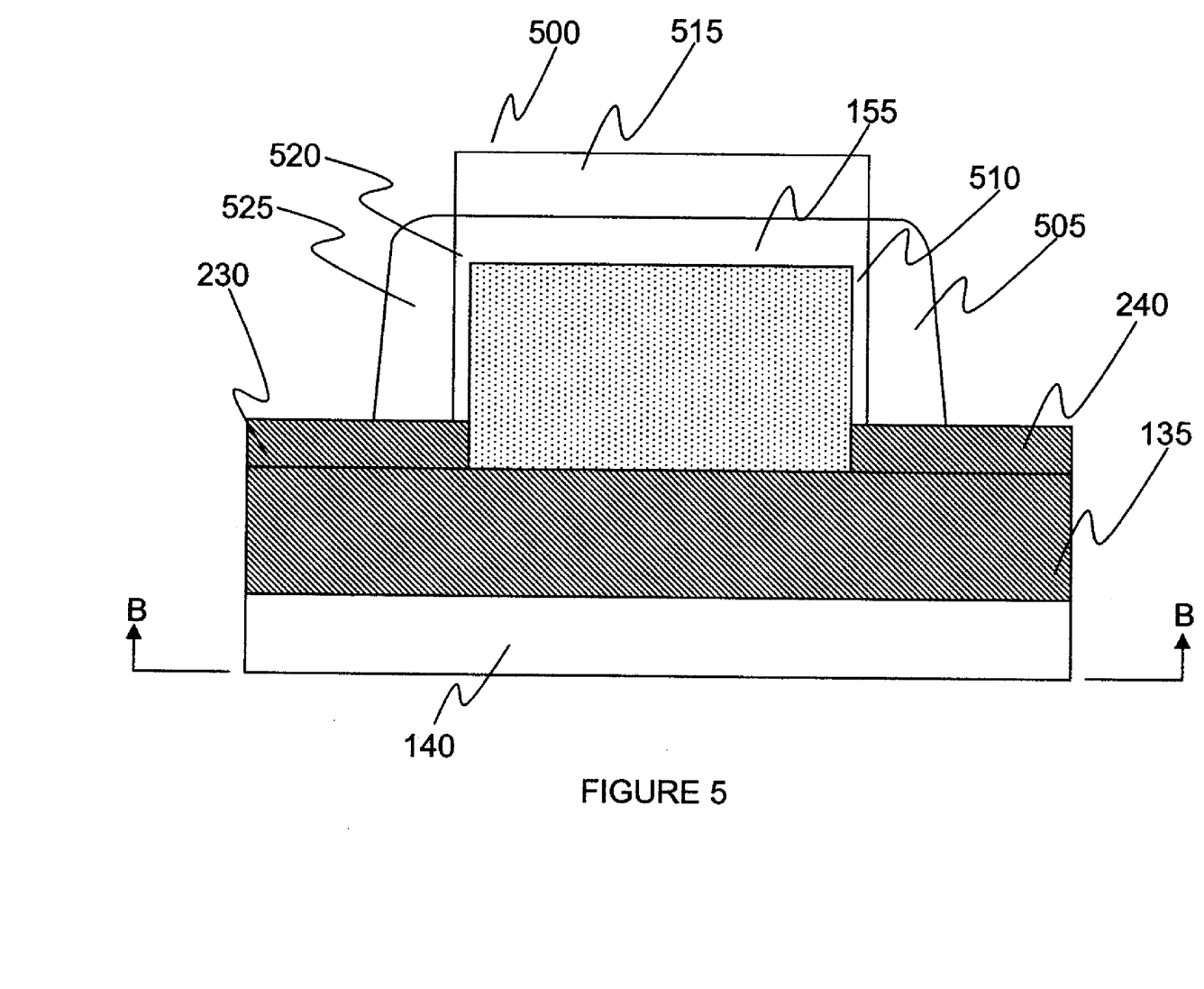
FIG. 5, shows cutaway view of an exemplary semiconductor structure with a raised source and drain, a protective silicon layer and sacrificial spacers according to the principles of the invention.

In the event the width of the STI is small, a thick silicon layer 400 along the sidewalls 410 and 420 may run the risk of bridging, i.e., forming an undesired connection between features (such as source and gate or drain and gate) of the device or between features of adjacent devices. Referring now to FIG. 5, to limit the thickness of the Si sidewalls 510 and 520 and avoid or reduce the risk of bridging, sacrificial oxide spacers 505 and 525 may be formed after an initial layer of silicon 500 is selectively epitaxially formed on the raised drain 160. Thus, silicon may be selectively epitaxially grown on the SiGe sidewalls of the raised drain 160, forming protective silicon sidewalls 510 and 520. The selective epitaxial process also results in growth of silicon 515 on the strained silicon layer 155. The epitaxial silicon layer 500 may be formed using conventional selective epitaxial growing processes known in the art, such as molecular beam epitaxy.

The spacers 505 and 525 may be formed along the Si coated SiGe sidewalls of the raised drain in a conventional manner, such as by oxide deposition, patterning and etching using processes known in the art. After formation of the spacers, an additional selective epitaxial growth step may be performed to complete formation of the raised drain. The oxide spacers 505 and 525 will prevent further formation of Si along the sidewalls during the additional selective epitaxial growth step. After completing the additional selective epitaxial growth step, the oxide spacers may be removed, such as by dry etching.

Following formation of the epitaxial silicon sidewalls 410 and 420 (or 510 and 520) and cap 430 (or 515), silicide contacts may be formed on the epitaxial silicon layer utilizing a conventional silicidation process. The presence of Ge in the SiGe underlying the silicon layer 400 (or 500) will not interfere with, degrade or otherwise adversely impact the silicidation process.

Those skilled in the art will appreciate that although FIG. 1 shows only one patterned gate stack region and corresponding raised source and drain regions, the invention applies equally as well when a plurality of patterned gate stacks and corresponding raised source and drain regions are formed on the SOI substrate. Thus, the invention is not limited to the embodiment wherein a single patterned gate stack region is employed.

While the invention has been described in terms of exemplary embodiments, those skilled in the art will recognize that the invention can be practiced with modifications and in the spirit and scope of the appended claims.

The invention claimed is:

1. A method of fabricating a semiconductor structure, comprising the steps of:
   forming a raised source region on a substrate;
   forming a raised drain region on the substrate; and
   forming a first silicon layer over the raised source region and a second silicon layer over the raised drain region,
   wherein the first silicon layer formed over the raised source region and the second silicon layer over the raised drain region include cap portions and sidewall portions, the method further comprising a step of forming sacrificial spacers along the silicon sidewall portions.

2. A method according to claim 1, wherein the substrate includes a SiGe layer atop a buried oxide layer.

3. A method according to claim 1, further comprising a step of forming a gate stack on the substrate.

4. A method according to claim 3, further comprising a step of forming a trench isolation surrounding the gate stack, source region and drain region.

5. A method according to claim 1, further comprising a step of forming a first silicide contact on the first silicon layer.

6. A method according to claim 1, further comprising a step of forming a second suicide contact on the second silicon layer.

7. A method according to claim 1, wherein the first silicon layer is epitaxially formed silicon and the second silicon layer is epitaxially grown silicon.

8. A method according to claim 1, wherein the raised drain region is comprised of a strained silicon layer atop a SiGe layer.

9. A method according to claim 8, wherein the strained silicon layer is comprised of epitaxially grown silicon.

10. A method according to claim 1, wherein the raised source region is comprised of a strained silicon layer atop a SiGe layer.

11. A method according to claim 10, wherein the strained silicon layer is comprised of epitaxially grown silicon.

12. A method according to claim 1, further comprising steps of:
    forming a third silicon layer over the cap of the first silicon layer over the raised source region; and
    forming a fourth silicon layer over the cap of the second silicon layer over the raised drain region.

13. A method according to claim 12, further comprising a step of removing the sacrificial spacers.

14. A method according to claim 13, wherein the step of removing the sacrificial spacers includes etching away the sacrificial spacers.

15. A method of fabricating a semiconductor structure, comprising:
    forming a raised source region on a substrate;
    forming a raised drain region on the substrate;
    forming a strained silicon layer on the raised source region and the raised drain region; and
    forming a silicon cap on the strained silicon layer.

16. A method according to claim 15, further comprising forming silicon sidewalls on the raised source region and the raised drain region.

17. A method according to claim 16, further comprising forming sacrificial spacers along the silicon sidewalls.

18. A method according to claim 17, further comprising forming a silicon layer on the silicon cap.

19. A method according to claim 18, further comprising removing the sacrificial spacers.

20. A method according to claim 19, further comprising forming silicide contacts on the silicon layer.

21. A method comprising:
    providing an SOI substrate having a patterned gate stack region comprising a gate dielectric formed on a surface thereof,
    providing isolation structures on sides of the patterned gate stack region;
    forming a gate stack on the gate dielectric;
    forming spacers along gate sidewalls of the gate stack;
    after spacer formation, forming raised source and drain regions comprising an SiGe layer;
    forming a silicon layer on the SiGe layer of the raised source and drain regions, wherein the silicon layer has a smaller lattice constant than Ge such that the silicon layer is strained in tension; and
    capping the raised drain region.

22. The method of claim 21, wherein the SOI substrate includes a buried oxide layer sandwiched between a top Si-containing layer and a bottom Si-containing layer.

23. The method of claim 22, wherein the top Si-containing layer and the bottom Si-containing layer comprise Si, SiGe, SiC, SiGeC, Si/Si or Si/SiGe.

24. The method of claim 21, wherein the SOI substrate is formed by bonding and cuffing processes or separation by implantation of oxygen (SIMOX) process.

25. The method of claim 21, further comprising forming a dielectric-capping layer on the gate stack comprising an oxide, nitride or oxynitride.

26. The method of claim 21, wherein the SiGe layer of the source and drain regions are selectively epitaxially grown.

27. The method of claim 21, wherein the SiGe layer of the source and drain regions are comprised, in whole or in part, of a top silicon-containing layer of the SOI substrate.

28. The method of claim 21, wherein a thickness for the strained Si layer on top of the SiGe layer is below a critical thickness.

29. The method of claim 28, wherein the critical thickness is a maximum thickness that the strained silicon layer can grow on the SiGe layer without forming defects in a crystal structure.

30. The method of claim 21, wherein the capping is formed from a silicon capping layer.

31. The method of claim 30, wherein the silicon capping layer is selectively epitaxially grown on the SiGe sidewalls of the raised drain region forming protective sidewalls.

32. The method of claim 30, further comprising forming oxide portions alongside the raised drain comprised of the SiGe layer and the strained Si layer.

* * * * *